United States Patent
Holt

[15] 3,660,772
[45] May 2, 1972

[54] WIDE-BAND DIRECT CURRENT COUPLED AMPLIFIER FOR ALTERNATING CURRENT UTILITY

[72] Inventor: Frederick Rodney Holt, Manhattan, N.Y.

[73] Assignee: The Hickok Electrical Instrument Company, Cleveland, Ohio

[22] Filed: May 13, 1970

[21] Appl. No.: 36,977

[52] U.S. Cl. ....................................330/18, 330/19, 330/20, 330/25, 330/26, 330/35
[51] Int. Cl. ....................................H03f 3/42
[58] Field of Search ....................................330/18–20, 25, 330/26, 30 D, 35, 69, 70, 97, 104, 112

[56] References Cited

UNITED STATES PATENTS 3,493,881 2/1970 Zuch ....................................330/18 UX
3,512,096 5/1970 Nagata et al. ....................................330/20 X
3,296,546 1/1967 Schneider ....................................330/104 X

FOREIGN PATENTS OR APPLICATIONS 497,733 11/1953 Canada ....................................330/70

*Primary Examiner*—Roy Lake
*Assistant Examiner*—James B. Mullins
*Attorney*—Baldwin, Egan, Walling & Fetzer

[57] ABSTRACT

A wide-band direct-current-coupled amplifier for alternating current use having substantially flat operating characteristics and a high signal-to-noise ratio between input and output signal levels; the amplifier consisting of a high impedance input stage formed of a capacitive divider coupled to three FETs connected into a triple cascode circuit, which input stage, in turn, is connected to a cascoded differential amplifier; the output stage being an emitter follower. Suitable feedback which is adjustable for each operating range throughout the band is effective to provide an output signal that varies linearly in proportion to the input signal.

4 Claims, 1 Drawing Figure

PATENTED MAY 2 1972
3,660,772
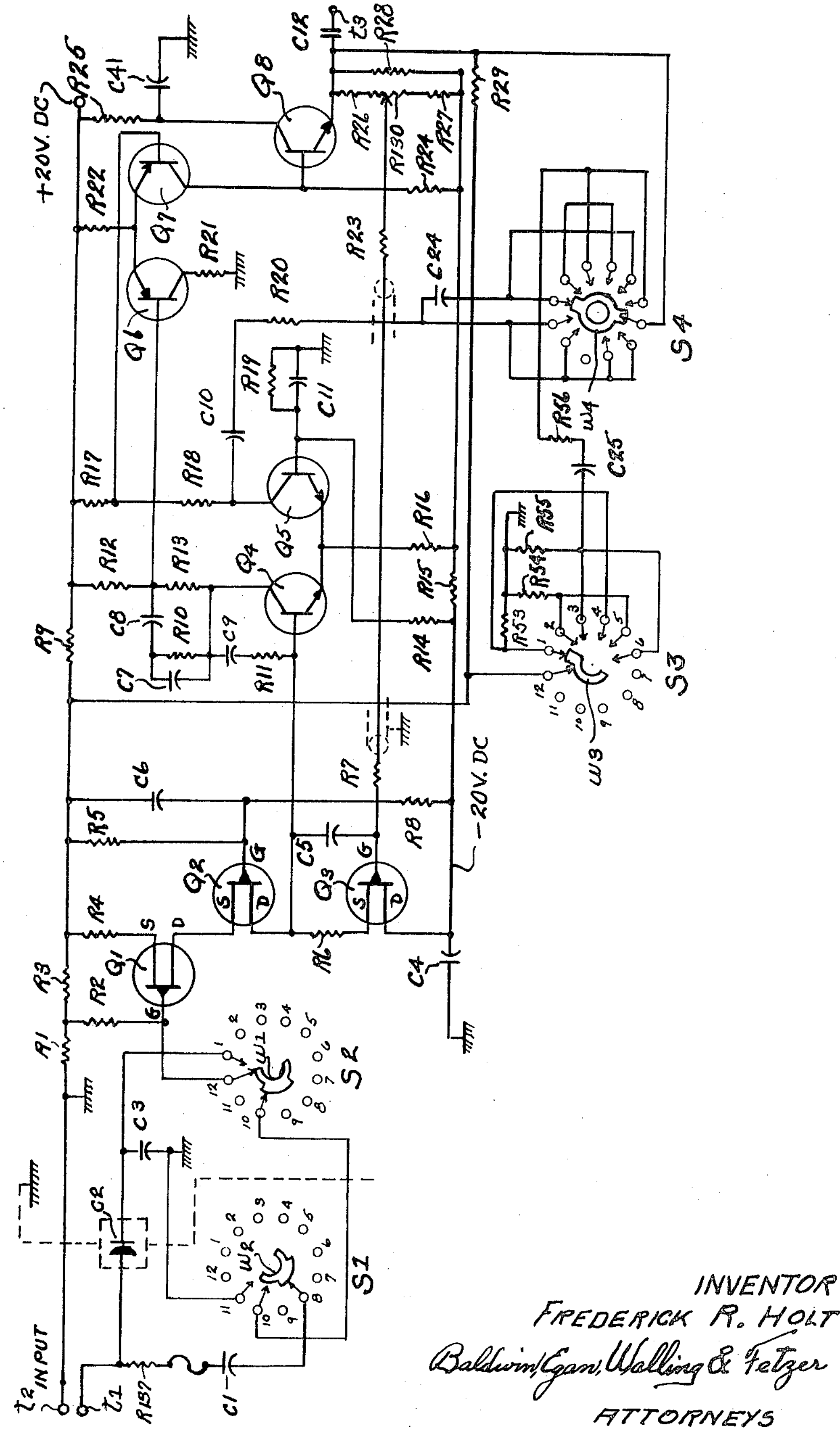
INVENTOR
FREDERICK R. HOLT
Baldwin, Egan, Walling & Fetzer
ATTORNEYS

WIDE-BAND DIRECT CURRENT COUPLED AMPLIFIER FOR ALTERNATING CURRENT UTILITY

A primary object of the present invention is to provide a direct current coupled amplifier for alternating current use which is operable over a wide band of signal frequencies and which is substantially flat in operating characteristics.

Another object of the amplifier of the present invention is to provide an amplifier having an input alternating circuit that requires no compensation throughout the operating range or band thereof.

Another object of the present invention is to provide an amplifier as described, and wherein it is provided with noninverting feedback to achieve high input impedance and dynamic stability throughout the operation band.

Additional objects and advantages of the amplifier of the present invention will be apparent to one skilled in the art to which it relates and upon reference to the following preferred description thereof and which is illustrated in the single schematic drawing.

Heretofore, in high precision wide-band multiple range alternating current amplifiers having provisions for variable gain control such amplifiers have been prohibitively expensive because the frequency response and gain thereof varies per each range. As a result, very involved and interacting adjustments are required for each range of gain in order to maintain constant frequency response.

Also, heretofore in amplifier systems as above described and which utilize voltage dividers as input attenuators, such attenuators have had to be laboriously adjusted in an effort to obtain suitable frequency response, oftentimes not obtainable.

Also, when the amplifier input impedance is required to be substantially high and constant, dividers heretofore used as input attenuators such as resistance dividers have been inadequate because they load the amplifier to thereby reduce the operating characteristics of the amplifier at low frequency levels as well as substantially reducing the input signal to noise ratio.

Likewise, in present day amplifier systems using low cost FET transistors, the same has suffered from wide variation and stability in its direct current operating conditions.

As will become hereinafter apparent, the amplifier of the present invention overcomes these disadvantages, and provides a stable amplifier having substantially high input impedance (1,000 megohms) capable of operating in wide-band multiple voltage range applications.

With reference directed to the aforesaid drawing, the amplifier of the present invention is identified in its entirety at 10, as will be hereinafter more apparent has an input impedance of approximately 1,000 megohms and includes an input circuit 12 comprised of a capacitor divider formed of capacitors C1, C2 and C3.

The values of these capacitor components, as well as the values of the other associated components of said amplifier are tabulated hereinafter.

As shown, the input is provided with terminals *t1* and *t2*, the latter also representing instrument ground. Terminal *t1* is connected to one side of capacitor C2, the opposite side of said capacitor connecting in parallel with one side of capacitor C3 and to a stationary contact 1 of rotary switch S1. The opposite side of capacitor C3 is connected to instrument ground.

One end of a resistor identified as R137 is connected to input terminal *t1* the opposite end being connected to one side of capacitor C1. The opposite side of said capacitor C1 is shown being connected to stationary terminal 8 of rotary switch S2.

Rotary switchs S1 and S2 may be a single switch assembly, having a plurality of levels, S1 representing one level and S2 a second level. The rotary contact identified as *w*1 for level S1 and *w*2 for level S2 may also be carried on a single shaft and rotatable therewith.

The instrument ground side of capacitor C3 is also shown to be connected to stationary terminal 11 of switch level S2.

As aforementioned, the input stage of the amplifier per se comprises a triple cascode circuit which, as shown in the drawing, includes three FETs transistors identified as Q1, Q2 and Q3.

The first transistor Q1 has its gate *g* connected to stationary terminal 12 of switch level S1. Likewise, stationary contacts 10 of switch levels S1 and S2 are connected together.

As shown, transistor Q1 is connected in its common-source configuration, having its bias resistances R2 and R3 connected in series between the gate and source electrodes, and resistance R1 connected between the junction of R2 and R3 and instrument ground. The source of said transistor is connected through resistor R3 to B+.

The rotary switch is intended to have six operative positions as connected to the input transistor Q1. As shown, the position of wiper contact *w*1 of switch level S1 is in contact with stationary contacts 10 and 12 connecting thereby directly to the gate of transistor Q1. Likewise, the wiper *w*2 of level S2 connects the stationary contacts 8 and 10 to each other whereby to connect input terminal *t*1 through capacitor C1 and said switch contacts directly to the gate of said transistor Q1.

Rotating the wiper contacts *w*1 and *w*2 of said rotary switch clockwise as shown in the schematic diagram successively to each of two of the next positions will also result in connecting the input terminal *t*1 directly to the gate electrode of said transistor Q1 through the coupling capacitor C1.

Threse three switch positions of said rotary switch represent the lower ranges of magnitudes of input voltage signal which the amplifier, in its present configuration, is capable of handling. The position of said switch provides a voltage range of between 0–10 millivolts; the next (clockwise) position a range of between 0–100 millivolts and the third (clockwise) position of between 0–1,000 millivolt signal.

The remaining three switch positions in a clockwise direction are as follows. For switch level S1, the wiper contact *w*1 is in engagement with stationary contacts 1 and 12.

For switch level S2 in the remaining three switch positions, the wiper contact is in engagement with only its contact 11 so that capacitor C1 is disconnected from the amplifier input.

As will be hereinafter apparent, additional switching elements identified as S3 and S4, which may also be ganged with switch levels S1 and S2, connect predetermined impedance elements (resistors and capacitors) into the amplifier circuit to variably control the gain of said amplifier such as to provide a signal of 2 volts RMS at the output for a maximum voltage input signal for each of the above referred to ranges.

The drain electrode of transistor Q1 as shown is connected to the source of transistor Q2, the second circuit part of the triple cascoded amplifier input, the latter being also connected in its common-gate configuration.

The gate G of transistor Q2 is connected by resistor R5 and capacitor C6 to B+ and by parallel connected resistor R8 to line 20, which is at a potential of −20v DC, said circuit providing AC positive feedback for said transistor Q1.

The drain D of Q2 is connected through resistor R6 to the source S of transistor Q3, the third circuit part of the triple cascode amplifier input. As shown Q3 is connected into the circuit and operates as a constant current generator, being part of a degenerative direct current feedback circuit to thus provide stability of operation for said amplifier, as will be later explained.

The amplifier also includes two cascoded differential amplifier stages comprising transistors Q4 and Q5 and associated circuit components differentially connected across the voltage sources (±20v DC), the input of said stage (base of transistor Q4) connecting directly (DC coupled) to the drain D of MOS FET Q2.

The aforementioned degenerative feedback circuit of transistor Q3 also includes variable potentiometer R130, resistor R23, resistor R7, capacitor C5 connected to the gate G of Q3 and to the DC coupling junction between Q2 and Q4 and resistor R6 connected at one end to the drain D of Q2 and at its opposite end to the source S of Q3.

The second differential amplifier stage is identified by transistors Q6 and Q7 and associated circuit components being of complementary type (PNP) with respect to differential stage Q4, Q5. As shown, this second differential stage is also directly coupled (DC) to the output (collector) of Q4 — first differential stage.

The output of said second differential amplifier stage (collector of Q7) is direct coupled to the output stage of the amplifier which is transistor Q8 connected as an emitter follower.

The signal output from said emitter follower Q8 is taken through coupling capacitor C12 and applied to output terminal T3.

As shown, variable potentiometer R130 heretofore referred to is connected in the emitter-base circuit of said follower Q8 being thus across the aforesaid voltage sources (±20v DC) and is operable in the feedback circuit of FET Q3 to provide a direct current operating level at the emitter of Q8 to between +3.5 and +4.0 v DC.

The amplifier circuit also includes another positive or regenerative feedback circuit connected between the amplifier output and the input, and comprises resistor R29 connected at its one end to the emitter of emitter follower Q8 and at its opposite end to stationary terminal 12 of rotary switch S3. Said terminal is also connected by conductor 25 to point (*a*1) which is the source S of transistor Q1.

Rotary switch S3 is also shown to have three resistors R53, R54 and R55 connected together at one end and to instrument ground.

The opposite end of resistor R53 is connected to stationary terminal 1 of rotary switch S3; the opposite end of resistor R54 to stationary contacts 2 and 5 and the opposite end of resistor R55 to stationary contacts 3 and 6 of said switch S3.

Another similar rotary switch identified as S4 is also used in the instant amplifier circuit as disclosed, and is seen to have its stationary terminal 7 connected to the emitter of transistor Q8.

Said switch S4 is connected between the output (collector) of Q5 by way of capacitor C10, resistor R20 and to stationary terminal 12 and also through capacitor C24 to terminal 1 of said switch.

In the switch position shown wherein the rotary contact *w*4 of said switch is in engagement with stationary contacts 1 and 7 feedback is provided between the emitter of Q8 and the emitter of Q5 of the differential amplifier effective to provide frequency compensations in the lowest range so as to stabilize the operation of said amplifier.

In the positions where the wiper *w*4 is in engagement with the pair of stationary contacts (3, 9) the emitter of Q5 is coupled through capacitor C10, resistor R20, switch S4, resistor R56, capacitor C25 to switch S3 to be part of the AC feedback path between the differential amplifier and the MOS FET Q1.

Switches S3 and S4 are shown in their respective positions when the amplifier is operating in its lowest range, i.e., 0–10 millivolt range.

In this position resistor R53 is connected in parallel with resistor R29 and R9 to provide a predetermined magnitude of feedback signal to the transistor Q1.

In the next clockwise position for switch S3, representing the next higher range (0–100 millivolt), resistor 54 is connected into the feedback circuit, replacing resistor R53 and in the third position (0–1,000 millivolt range) resistor R55 is in circuit.

The values of resistors R53, R54 and R55 are preselected to provide a gain for the amplifier such that the output of the amplifier (collector of Q8) is 2v RMS for a full scale or maximum input signal in each operating range for the amplifier. For example, in the 0–10 millivolt range, the output signal is intended to be 2v RMS for an input signal of 10 millivolts. In like manner for a maximum input signal in the range (0–1,000v olts) the output signal is still 2v RMS.

The amplifier is intended to be linear throughout its complete operating range and hence the gain is made variable by the aforesaid feedback circuitry.

As shown, switches S1–S4 may be ganged together as a multi-level switch therein the wiper contacts *w*1–*w*4 are disposed on a single shaft and rotatable together.

In operation, for the first three positions of switches S1–S4, i.e., the position illustrated and the next two positions clockwise from said illustrated position, the input voltage signal is capacitively coupled directly into the input of the amplifier. Inasmuch as the amplifier, as described, has an input impedance of 1,000 megohm very low signal current flows through resistor R137 and fuse F1, so long as the amplifier operates in its linear range. The amplifier parameters are designed so that when overloads in excess of 20v RMS are applied, breakdown of the front end section of the amplifier occurs, causing fuse F1 to draw current in excess of 5mA. At excessive currents the fuse has a maximum blow time of approximately 100$\mu$ seconds. Thus, the fuse opens to disconnect the input prior to damaging power dissipation levels in said amplifier.

For the next three positions of said switches, the upper three ranges of said amplifier, the input voltage signal is attenuated via the capacitive divide C2, C3 prior to its application to the amplifier input. The capacitive divide has a tracking ratio temperature coefficient of 6ppm/°C. and an attenuation rate of −60 db ±3 percent. The attenuation by said capacitor divide causes 99.9 percent of the input voltage signal to be dropped across the 10pf input capacitor C3, which has a conservative working voltage rating of 1,000v. The remaining 0.1 percent of the input voltage is applied directly to the input of the amplifier.

The source electrode S of the input FET transistor Q1 as aforementioned is bootstrapped by the external gain control circuitry (R29, R9 and either one of R53, R54 and R55) which feeds back a signal of the same phase and amplitude (−E1) as the input signal, where E1 is equal to $E$ out/$G$1 and the nominal open loop gain ($G$1) of the amplifier is about 98 db. Also, the combination of transistor Q2 and capacitor C6 serves to bootstrap the drain of transistor Q1, thus completely bootstrapping Q1 to provide maximum input impedance while minimizing the input capacitance. The signal, as applied to the two differential amplifier stages (Q4 and Q5) (Q6 and Q7) provides sufficient gain for the output swing of said signal at the drain of transistor Q2.

To provide reasonable amplifier DC overload recovery time, the DC input impedance of the amplifier is designed to be held to approximately 1,000 megohms by said 90 percent positive source resistive feedback return through the 100 megohm resistor R2 to the gate of transistor Q1. Also, the DC stability of the amplifier is governed by the 100 percent negative DC feedback network from the output DC level to the gate of the cascode current generator (Q3) which, as previously described, comprises potentiometer R130, resistor R7, current generator Q3 and resistor R6 to the drain electrode D of transistor Q2. The output of the amplifier DC operating point at the emitter of the emitter follower Q8 is adjusted via potentiometer R130 to be between +3.5 and 4.0v.

And, as previously indicated, the closed loop gain of the amplifier is controlled by the selected feedback combinations of resistor R29 in parallel with either resistors R53, R54 or R55 through switch S3, the combination of which provides the proper gain combination for the range or level setting of the amplifier. The selected gain for each level is such that the amplifier output (emitter of Q8) is always 2v RMS for a sine wave input signal that is the maximum for each range.

The amplifier is linear in each range such that the output AC signal: $e_{out}$(Ampl.) = $E_{in}$ × (attenuation db + ampl. gain db) where: $E_{in}$ is the input signal (AC); attenuation db is the attenuation provided by the capacitive divide; and, ampl. gain db is the gain (closed loop) of the amplifier.

The following list of components identify a practical amplifier assembly which performs in the manner as described herein:

| Component Reference | Specification |
| --- | --- |

| | |
|---|---|
| C1 | Capacitor, Fixed, Polyester Film: 2200 pF, 10%, 1000 volts |
| C2 | Capacitor, Fixed: 10 pF. |
| C3 | Capacitor, Fixed, Glass Dielectric: 10,000 pF, 1%, 300 volts |
| C4 | Capacitor, Fixed, Electrolytic: 5$\mu$ F, 64 volts |
| C5 | Capacitor, Fixed, Epoxy Dipped, Polyester Film: .047 $\mu$F, 10%, 200 volts |
| C6 | Capacitor, Fixed Metallized Lacquer Film: .47 $\mu$F, 10%, 50 volts |
| C7 | Capacitor, Fixed, Dipped Mica: 270 pF, 5%, 500 volts |
| C8 | Capacitor, Fixed, Dipped Mica: 10 pF, 10%, 500 volts |
| C9 | Capacitor, Fixed, Molded Composition: 1.1 pF, 5%, 500 volts |
| C10 | Capacitor, Fixed, Molded Composition: 8.5 pF, 5%, 500 volts |
| C11 | Capacitor, Fixed, Epoxy Dipped, Polyester Film: .1 $\mu$F, 10%, 100 volts |
| C12 | Capacitor, Fixed, Alumalytic: 100 $\mu$F, 25 volts |
| C24 | Capacitor: calibration |
| C25 | Capacitor, Fixed, Molded Composition: 1.2 pF, 5%, 500 volts |
| C41 | Same as C4 |
| Q1 | Transistor: FET, S-25013 |
| Q2 | Transistor: selected |
| Q3 | Transistor: selected |
| Q4, Q5 | Transistor: matched pair of 2N3904 |
| Q6, Q7 | Transistor: matched pair of 2N3906 |
| Q8 | Transistor: 2N3904 |
| R1 | Resistor, Fixed, Composition: 10 megohms, 10%, ½ watt |
| R2 | Resistor, Fixed, Composition: 100 megohms, 10%, ½ watt |
| R3 | Resistor, Fixed, Composition: 1 megohm, 10%, ½ watt |
| R4 | Resistor, Fixed, Metal Film: 31.6 ohms, 1%, ½ watt |
| R5 | Same as R3 |
| R6 | Resistor, Fixed, Metal Film: 475 ohms, 1%, ½ watt |
| R7 | Resistor, Fixed, Composition: 1 megohm, 10%, ¼ watt |
| R8 | Resistor, Fixed, Composition: 2.2 megohms, 10%, ½ watt |
| R9 | Resistor, Fixed, Metal Film: 7.15K ohms, 0.5%, ½ watt |
| R10 | Resistor, Fixed, Composition: 1.5K ohms, 10%, ¼ watt |
| R11 | Resistor, Fixed, Composition: 220 ohms, 10%, ¼ watt |
| R12 | Resistor, Fixed, Composition: 2.2K ohms, 10%, ¼ watt |
| R13 | Resistor, Fixed, Composition: 2.7K ohms, 10% ¼ watt |
| R14 | Resistor, Fixed, Composition: 10K ohms, 10%, ¼ watt |
| R15 | Resistor, Fixed, Composition: 100 ohms, 10%, 178 watt |
| R16, R17 | Same as R12 |
| R18 | Same as R13 |
| R19 | Resistor, Fixed, Composition: 18K ohms, 10%, ¼ watt |
| R20 | Resistor, Fixed, Composition: 470 ohms, 10%, ¼ watt |
| R21 | Resistor, Fixed, Composition: 820 ohms, 10%, ¼ watt |
| R22 | Same as R11 |
| R23 | Same as R2 |
| R24 | Resistor, Fixed, Composition: 3.9K ohms, 10%, ¼ watt |
| R25 | Resistor, Fixed, Composition: 330 ohms, 10%, ¼ watt |
| R26 | Same as R13 |
| R27 | Resistor, Fixed, Composition: 1000 ohms, 10%, ¼ watt |
| R28 | Resistor, Fixed, Composition: 5.6K ohms, 10%, ¼ watt |
| R29 | Resistor, Fixed, Metal Film: 6.19K ohms, 0.5%, ½ watt |
| R53 | Resistor, Fixed, Metal Film: 30.9 ohms, 0.5%, ½ watt |
| R54 | Resistor, Fixed, Metal Film: 340 ohms, 0,5%, ½ watt |
| R55 | Resistor, Fixed, Metal Film: 45K ohms, 0.5%, ½ watt |
| R56 | Resistor, Fixed, Metal oxide: 200K ohms, 5%, ½ watt |
| R130 | Resistor, Variable: wire wound, 2K ohms, 20%, 2 watt |
| R137 | Resistor, Fixed, Composition: 1.8K ohms, 5%, ¼ watt |

What is claimed is:

1. A wide-band, direct-coupled, multi-stage amplifier comprising a direct current supply, a first stage for receiving an input alternating current signal connected to said supply and including a first FET transistor connected in its common source configuration, a second FET transistor connected in its common gate configuration in series with said first transistor to define a cascode pair, a third FET transistor connected as a constant current generator between said second transistor and said supply to provide direct current stabilization, differential amplifier means direct coupled to the second transistor of said cascode pair, fourth transistor means connected to said differential amplifier means and defining the output of said amplifier, first feedback circuit means connected between said fourth transistor means and said first and second transistors effective to provide an increased gain of said series connected cascode pair of said first and second transistors, and second direct current negative feedback circuit means connected between said fourth transistor means and said third transistor effective to provide direct current stabilization for said second transistor.

2. In a wide-band direct-coupled multi-stage amplifier as is defined in claim 1 and wherein attenuator means are connected to the first stage effective to attenuate a predetermined part of the input signal.

3. In a wide-band direct-coupled multi-stage amplifier as is defined in claim 2 and wherein the attenuator means includes a capacitive divide.

4. In a wide-band direct-coupled multi-stage amplifier as is defined in claim 3 and wherein the capacitive divide includes two capacitors in parallel and which are effective to attenuate the input signal within the range of 99.9 percent.

* * * * *